United States Patent [19]

Bingham

[11] 4,195,266
[45] Mar. 25, 1980

[54] COMMUTATING SIGNAL LEVEL TRANSLATOR

[75] Inventor: David Bingham, Los Altos, Calif.

[73] Assignee: Intersil, Inc.,, Cupertino, Calif.

[21] Appl. No.: 911,496

[22] Filed: Jun. 1, 1978

[51] Int. Cl.² ............................................. H03F 1/02
[52] U.S. Cl. ........................................ 330/9; 330/51
[58] Field of Search ............................. 330/9, 11, 51; 324/123 R, 123 C

[56] References Cited

U.S. PATENT DOCUMENTS

| 3,387,224 | 6/1968 | Fleischer et al. | 330/9 X |
| 3,535,646 | 10/1970 | Quinn | 330/9 X |
| 4,068,182 | 1/1978 | Dingwall et al. | 330/9 |

FOREIGN PATENT DOCUMENTS 2327877  12/1974  Fed. Rep. of Germany ............ 330/51

Primary Examiner—James B. Mullins
Attorney, Agent, or Firm—Alvin E. Hendricson

[57] ABSTRACT

A system or circuit for signal level translation by information storage on multiple capacitors subjected to commutation at a frequency higher than the highest preserved frequency component of the signal. Continuous level translation of information, such as successive voltage levels, is accomplished with very small error. The invention is particularly applicable to instrumentation amplifiers for example, wherein differential input voltages are required to be referenced to some other base voltage such as zero or ground voltage.

10 Claims, 6 Drawing Figures

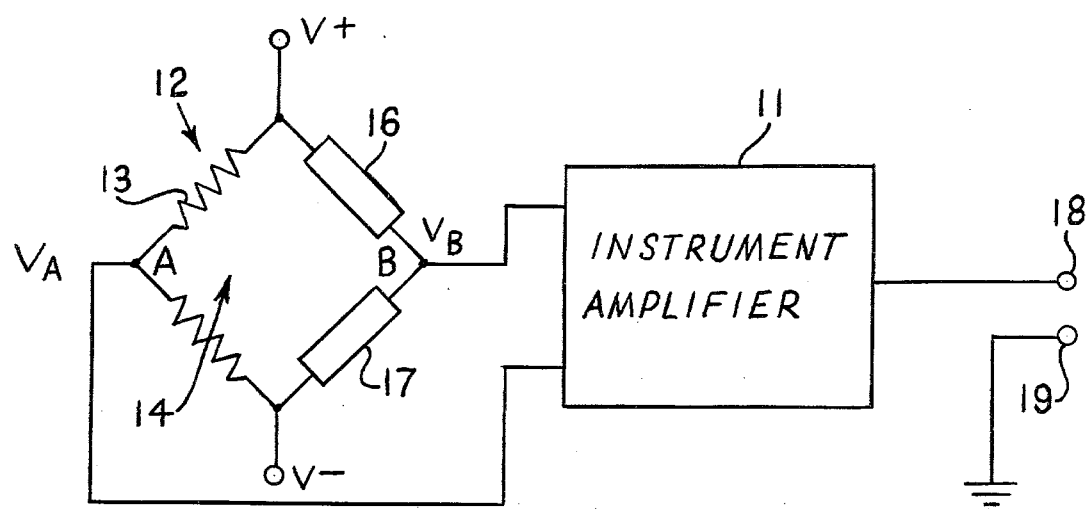
*FIG. 1*
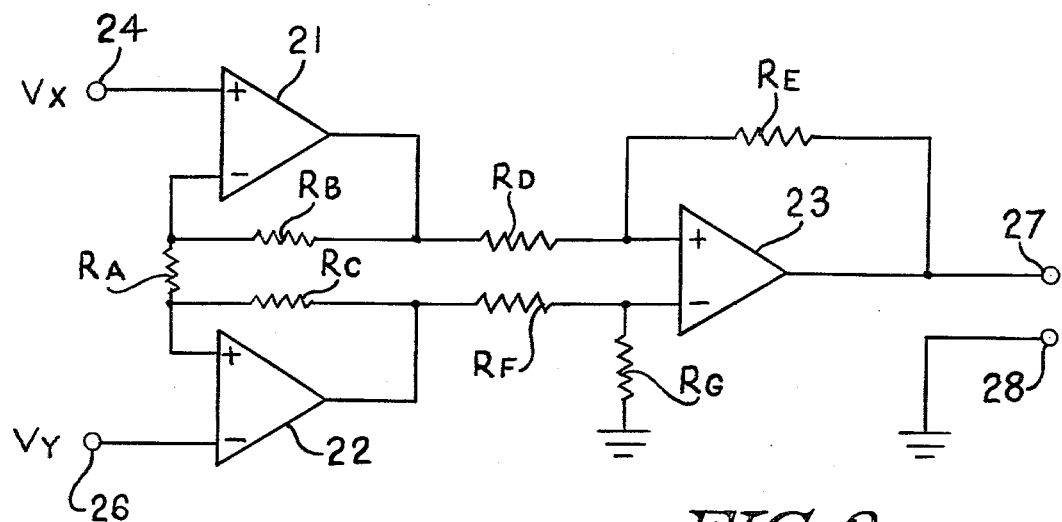
PRIOR ART  *FIG. 2*

COMMUTATING SIGNAL LEVEL TRANSLATOR

BACKGROUND OF INVENTION

Although the present invention relates generally to signal level translation and, in particular, to processing of differential signals, the invention is hereinafter referenced to instrumentation amplifiers as a primary example of the applicability of this invention. Consequently, the following discussion of prior art or the like pertains to this application as exemplary of an appropriate background of the invention. It is noted in this respect that an instrumentation amplifier is required to provide an output signal that is "N" times the value of an input differential voltage, ($V_A - V_B$), wherein "N" is a real number. An instrumentation amplifier output voltage is normally not referenced to either of the input signal values $V_A$ or $V_B$ between which the differential voltage exists, but instead, is referenced to a third voltage which may, for example, be a zero or ground voltage. An instrumentation amplifier should respond only to the difference voltage and not to the absolute values of voltages $V_A$ or $V_B$. The error caused by a shift in the voltages $V_A$ and $V_B$ i.e., common mode rejection ratio, may be limited to about 100 db by the use of good instrumentation amplifiers and this will be seen to produce an output error of $10^{-5}$ volts for a shift of 1 volt in the absolute value of the voltages $V_A$ and $V_B$. In applications wherein the amplifier is required to process differential signals in the range of $10^{-5}$ volts, it will be seen that a substantial error would be introduced for such a voltage shift.

It is also noted that instrumentation amplifiers are required to present a high impedance at the inputs thereof so that the preceding bridge network or the like will not be loaded by the amplifier. A conventional or typical instrumentation amplifier may employ three operational amplifiers resistively coupled together and this then requires an exact correspondence of particular resistor values in order to preclude the introduction of an additional common mode error. Thus conventional systems employed for instrumentation amplification, for example, must not only employ operational amplifiers that in themselves have low offset voltages and low common mode rejection ratios, but also the resistor network matching must be very precise, in order to preclude the introduction of major errors.

The present invention provides a simple solution to the problems of signal level translation, such as occurs in instrumentation amplifiers by means which may be readily integrated, so as to produce a highly advantageous result.

SUMMARY OF INVENTION

The present invention provides in simplest form, a pair of capacitors that are alternately charged to the input differential voltage to be amplified, and are then alternately switched so that one terminal of each capacitor is connected to a reference voltage such as electrical ground and the other terminal is connected to an amplifier. The alternate charging and discharging of the two capacitors are controlled at a commutating rate which is greater than the highest frequency or frequency component of a differential voltage to be amplified, and in this manner, all information is transmitted to the output of the amplifier with a delay equal to or less than the commutation period, depending upon the commutation duty cycle.

The amplifier employed in the present invention may be a simple high input inpedance operational amplifier correctly nulled for offset or a commutating autozero amplifier, as described in my co-pending U.S. patent application Ser. No. 861,525, or other suitable amplifier. This amplifier has the non-inverting input thereof alternately connected to the abovenoted capacitors and the inverting input connected through a resistor $R_1$ to a reference or ground voltage and through a resistor $R_2$ to the output of the amplifier. The common mode rejection ratio error is that of the amplifier only and is not dependent on the resistors $R_1$ and $R_2$. The gain of the system is dependent only upon $R_1$ and $R_2$ and has a value equal to $(R_1 + R_2)/R_1$.

The present invention provides a very significant advance in the art because of the exceptionally large common mode rejection ratio (CMRR) inasmuch as level translation is achieved by switches and not by analog amplifiers or conventional signal translators. The input signal, when applied to the amplifier, is always referenced to ground or some other defined reference voltage so that the effect of the CMRR of the amplifier is minimal.

In addition to the foregoing, the present invention is highly advantageous in having a very low sensitivity to the value of the capacitors and resistors $R_1$ and $R_2$. As previously noted, the resistors $R_1$ and $R_2$ solely affect the voltage gain of the system and in no way affect the CMRR. Because of this lack of sensitivity on the performance of components of the system the yield of this type of circuit in integrated form is very high and, consequently, the cost is minimized.

The circuit or system of the present invention may be readily implemented in CMOS technology although integration may be otherwise accomplished. All components of the present invention may be integrated in a single die although for a maximum flexibility and minimum cost, it may be desirable to employ external capacitors and amplifier resistors.

DESCRIPTION OF FIGURES

The present invention is illustrated as to a particular preferred embodiment thereof in the accompanying drawings, wherein:

FIG. 1 is a circuit diagram of an instrument bridge network connected to an instrumentation amplifier shown in block form, as an example of an application of the present invention;

FIG. 2 is a circuit diagram of a conventional instrumentation amplifier known in the prior art;

DESCRIPTION OF PREFERRED EMBODIMENT

Figure 3:
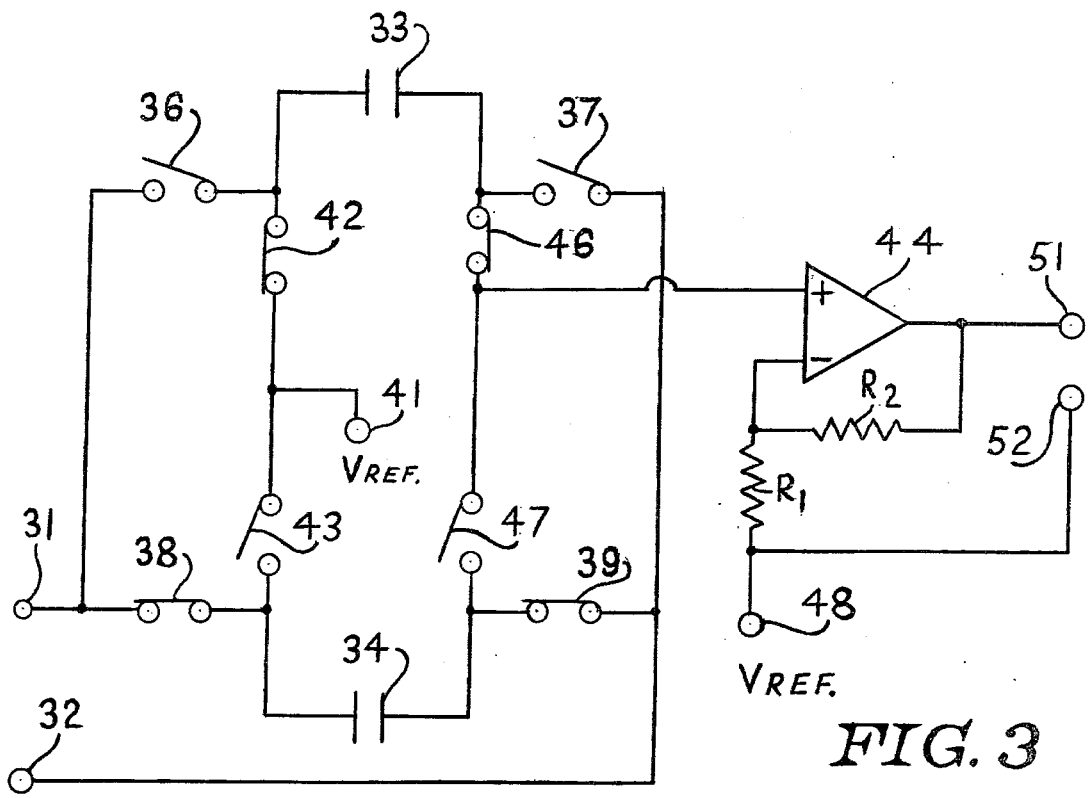
FIG. 3 is a circuit diagram of instrumentation amplifier formed in accordance with the present invention.

FIG. 1 of the drawings illustrates a conventional application of an instrumentation amplifier 11 which may comprise a prior art amplifier or the system of the present invention. This typical application utilizes a bridge network 12 including resistors 13 and 14 connected in series between V+ and V− with a node A at the junction of the resistors, and a series combination of elements 16 and 17 which may, for example, be transducers, temperature sensors, light sensors or the like, connected in parallel with the resistors between V+ and V−. A node B exists at the junction of elements 16 and 17. The resistors are designed or adjusted, as indicated at resistor 14, to establish a convenient value of the voltage $V_A$ appearing at node A, so that the voltage difference between $V_A$ and $V_B$ falls within a range readily handled by the amplifier 11. The instrumentation amplifier amplifies by a factor N, the differential voltage $(V_A-V_B)$ and provides an output $N(V_A-V_B)$ which is normally referenced to a third voltage which is illustrated in FIG. 1 to be a ground voltage. The amplifier provides an amplification N and the output appears between the output terminals 18 and 19, where this latter terminal is connected to electrical ground or some other reference voltage.

Various problems of instrumentation amplifiers have been noted above, and in this respect reference is made to FIG. 2 illustrating a typical instrumentation amplifier employing three operational amplifiers 21, 22 and 23. The non-inverting input of amplifier 21 is connected to input terminal 26. The operational amplifiers 21 and 22 are employed as a high impedance differential amplifier with a resistor $R_A$ connecting the inverting input of amplifier 21 to the non-inverting input of amplifier 22 and feedback resistors $R_B$ and $R_C$ being provided for amplifiers 21 and 22, respectively. This differential amplifier has a gain of $$1 + \left[\frac{R_B + R_C}{R_A}\right].$$

The differential signal from the amplifiers 21 and 22 is converted to a signal referenced to $V_{REF}$ by the operational amplifier 23, and the resistor network including resistor $R_D$, connecting the output of amplifier of 21 to the non-inverting input of amplifier 23, feedback amplifier $R_E$ for amplifier 23, resistor $R_F$ coupling the output of amplifier 22 to the inverting input of amplifier 23, and resistor $R_G$ connecting the inverting input of amplifier 23 to $V_{REF}$ which, in this instance, is illustrated to be electrical ground. The amplified differential signal appears between a terminal 27 connected to the output of amplifier 23, and a terminal 28 connected to ground.

Assuming a voltage $V_X$ is applied to terminal 24, and a voltage $V_Y$ is applied to terminal 26 to thus establish an input differential voltage $V_{XY}$, the gain of this stage is:

$$\left[1 - \frac{R_D + R_E}{R_D}\right] \cdot V_{XY}$$

This relationship is only true if $R_D/R_E = R_F/R_G$ and ignoring the effects of the common mode rejection ratio of amplifier 23. Unless this ratio is very exact, a common mode error will occur. This then means that the output voltage between terminals 27 and 28 will be dependent not only on the differential voltage, but also on the absolute values of the voltages $V_X$ and $V_Y$. Inasmuch as the differential voltage may be many orders of magnitude less than in either of $V_X$ or $V_Y$, this causes a serious problem. Assuming $V_X = V_Y$, it can be shown that the output voltage is given by the relationship $$V_{OUT} = V_X (\text{or } V_Y) \cdot \left[1 - \frac{(1 + \frac{R_E}{R_D})}{(1 + \frac{R_G}{R_F})}\right]$$

It will be seen that this equation only equals zero under the circumstances wherein $R_E/R_D = R_G/R_F$. If $R_E/R_D \neq R_G/R_F$, an error voltage will result at the output, i.e., a CMRR voltage. It can be shown that for a unity gain configuration, the error is about one-half of the resistor ratio mismatch, and that for a high gain configuration the error approaches that of the resistor ratio mismatch. For a good instrumentation amplifier, the CMRR should be greater than 100 db, which then necessitates the resistor ratio matching be better than 0.001 percent. Additional CMRR errors occur in the operational amplifier itself, and the first stage differential amplifier which provides the input signal to the operational amplifier. Consequently, it will be seen that for conventional instrumentation amplifiers, the operational amplifiers thereof must, in themselves have low offset voltage and low CMRR values, and in addition, the resistor network matching must be very precise. It is believed quite clearly this imposes very serious limitations upon instrumentation amplifier design and the manufacture. Although other instrumentation amplifier configurations exist besides the one shown in FIG. 2, it is noted that all have similar problems of component matching, common mode rejection ratio and complexity.

Reference is now made to FIG. 3 of the drawings illustrating a preferred embodiment of the present invention, adapted for use as an instrumentation amplifier, for example, and having input terminals 31 and 32 which may be connected to nodes A and B of the bridge network 12 of FIG. 1. The circuit of FIG. 3 will be seen to include a pair of like capacitors 33 and 34, with capacitor 33 being connected on one side thereof to input terminal 31 through switch 36, and on the other side thereof to input terminal 32 through switch 37. Capacitor 34 is connected at one side thereof to input terminal 31 through switch 38 and at the other side thereof to input 32 through switch 39. A reference voltage terminal 41 is provided for connection to electrical ground or some other reference voltage and this terminal is connected through a switch 42 in series with switch 36 to input terminal 31 and through a switch 43 in series with the switch 38 to input terminal 31. There is also provided an amplifier 44 having a non-inverting input thereof connected to a switch 46 connected in series with the switch 37 to the input terminal 32, and to a switch 47 connected in series with the switch 39 to the input terminal 32. These switches described above are adapted to be operated in groups at a predetermined commutation rate, as described below.

The amplifier 44 of FIG. 3 has the inverting input thereof connected through a resistor $R_1$ to a voltage reference terminal 48 and has a feedback resistor $R_2$ connected between the output of the amplifier and the inverting input thereof. The output of the amplifier 44 is shown to be connected to an output terminal 51 with a second output terminal 52 connected to the voltage reference terminal 48. It is noted that the reference voltage $V_{REF}$ may, for example, comprise electrical ground and this voltage is normally the same $V_{REF}$ as applied to terminal 41.

The circuit of FIG. 3 is operated by successively opening and closing the switches thereof in predetermined groups to alternately connect each of the capacitors 33 and 34 for charging to the input differential voltage and then connecting one terminal of each capacitor to $V_{REF}$ and the other terminal to an input of the amplifier 44. The foregoing is accomplished by closing switches 38, 39, 42 and 46, while switches 36, 37, 43 and 47 are open and then opening switches 38, 39, 42 and 46 while closing switches 36, 37, 43 and 47. The rate at which the switches are opened and closed is the commutating rate of the present invention, and this switch opening and closing may be accomplished in a variety of ways, such as, for example, by the utilization of clock pulses operating electronic switches.

Figures 4A, 4B:
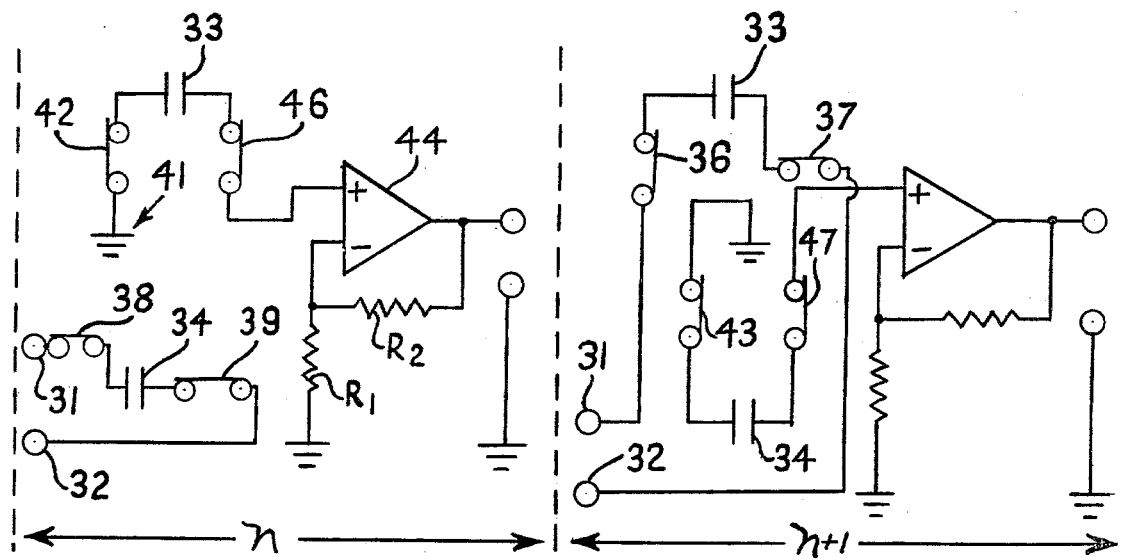
FIGS. 4A and 4B are partial circuit diagrams illustrating capacitor and amplifier connections during successive commutating periods n and n+1.

In FIGS. 4A and 4B, there are illustrated the circuits completed during a first period n and a subsequent period n+1. In FIG. 4A, it will be seen that the switches 38 and 39 are closed to thus connect the capacitor 34 across the input terminals 31 and 32, and at the same time, switches 42 and 46 are closed to connect the capacitor 33 between $V_{REF}$, illustrated as electrical ground, and the non-inverting input of the amplifier 44. The other switches of the circuit which are open during this period n, are not shown in FIG. 4A. In the subsequent period n+1, the alternate switches are closed and thus it will be seen that the capacitor 34, which was charged during the period n, is then disconnected from the input terminals 31 and 32 and is connected through switches 43 and 47 between electrical ground and the non-inverting input of the amplifier 44. The other capacitor 33 is connected through the switches 36 and 37 across the input terminals 31 and 32. It will be seen that in this manner the present invention operates to alternately charge each of the capacitors to the input differential voltage and in the next time period to connect the charged capacitor between a reference voltage, such as electrical ground, and an input of the amplifier. In this manner, the amplifier then actually does receive the differential voltage to be amplified without requiring any resistor network or additional amplifiers or the like, as in conventional systems. The switches are operated at a finite rate for interchanging or commutating the two capacitors, as described above, with the commutation rate being greater than the highest frequency or frequency component of the differential voltage, so that all information is transmitted to the output of the amplifier 44. It will be appreciated that there is a delay in transmittal of information, with the delay time being equal to or less than the commutation period, depending upon the commutation duty cycle. As a practical matter, the commutation mode is normally quite high, so that substantially instantaneous voltage values are applied to the amplifier in very rapid succession; however, it is actually only necessary for the commutation rate to be greater than the highest frequency component of the differential voltage that it is desired to measure or translate.

The successive commutation periods repeat the connections of the periods n and n+1 illustrated in FIGS. 4A and 4B. Thus n+2 is the same as n and n+3 is the same as n+1. The gain of the system illustrated in FIG. 3 and described above is equal to $(R_1+R_2)/R_1$. A truly exceptional CMRR is achieved by the present invention and the translated signal is always referenced to ground or some other defined reference voltage, so that the effect of the CMRR of the amplifier is minimal. The circuit of the present invention also exhibits a marked lack of sensitivity to the values of the capacitors and resistors. The resistors $R_1$ and $R_2$ only affect the voltage gain of the system and in no way affect the CMRR. This lack of sensitivity to the performance of circuit components provides for a high yield of this invention in integrated form. As previously noted, the present invention may be readily implemented in CMOS technology, although integration is not limited to that technology.

The present invention has been described above with respect to a particular application thereof, wherein a differential voltage applied to the input terminals thereof is translated or referenced to some predetermined reference voltage. It is noted that the present invention is not limited to this application, for in fact, the present invention has a wide variety of applications other than the one described above. Thus, for example, the present invention is highly advantageous in converting a signal referenced to a system A to a signal referenced to a system B. A system A may, for example, have a negative or electrical ground reference from which the signals are measured. A system B, on the other hand, may have a reference voltage of +5 volts, and the present invention is particularly adapted to interconnect system A with system B. In the foregoing example $V_{REF}$ will be provided as +5 volts at terminals 41 and 48 of FIG. 3, for example. It is also possible with the present invention to employ different values of reference voltage at terminals 41 and 48 of FIG. 3. In this situation, the output signal between the terminals 51 and 52 would be shifted by an amount equal to the gain, $(R_1+R_2)/R_1$, times the difference in reference voltages, i.e., $V_{REF41}-V_{REF48}$. Such an arrangement will be seen to intentionally introduce a DC offset voltage in the output which may be particularly advantageous for certain applications. It is also noted that the inverting and non-inverting inputs to the amplifier of FIG. 3 may be reversed. Various other applications of the present invention will be apparent to those skilled in the art.

Figure 5:
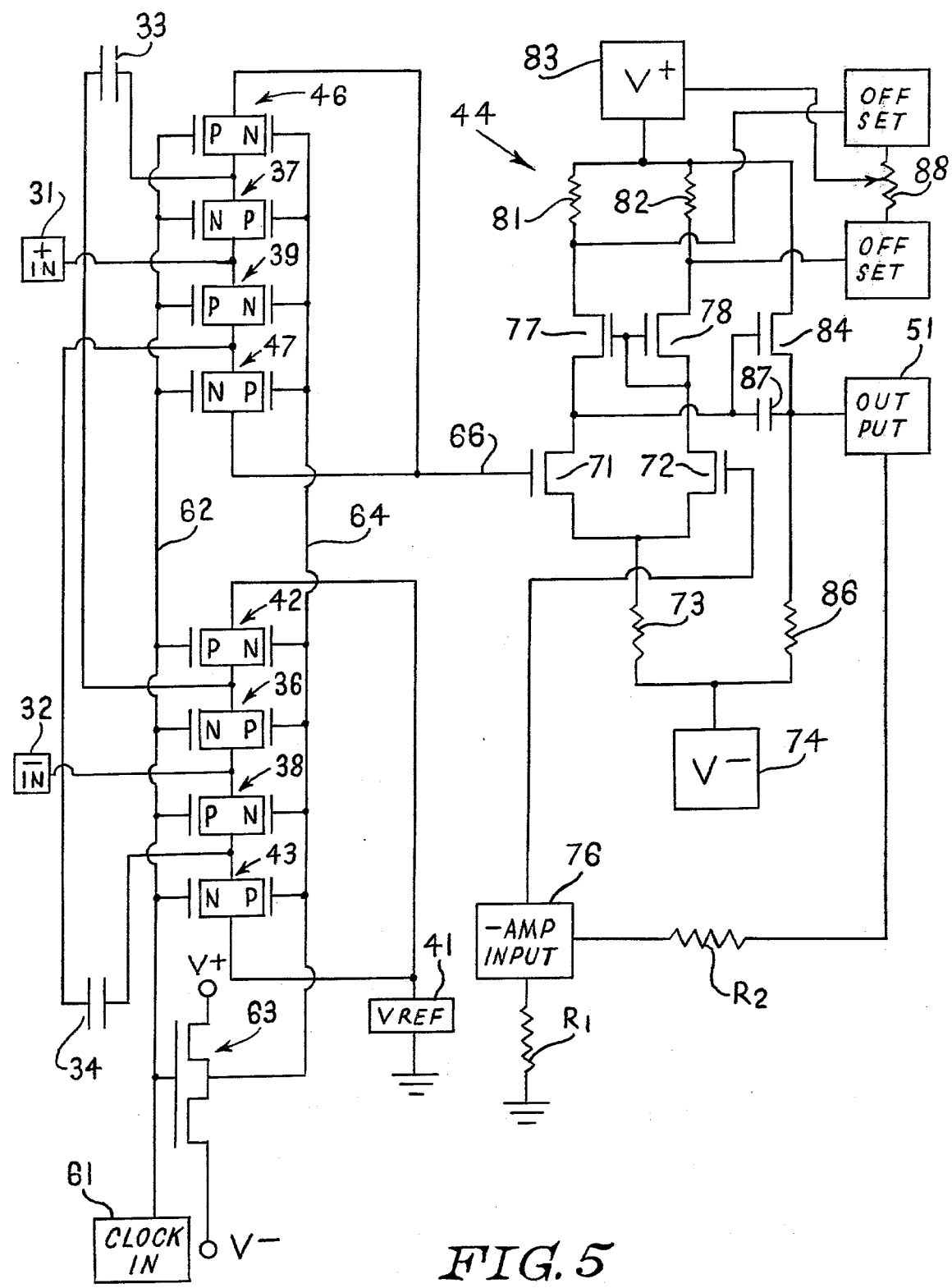
FIG. 5 is a schematic illustration of a complete instrumentation amplifier suitable for integration in CMOS technology.

FIG. 5 of the drawings illustrates a complete instrumentation amplifier suitable for integration in CMOS technology. Referring now to FIG. 5, it is noted that the CMOS switches and other circuit elements are identified by the same numbers as in FIG. 3. All of the switches are provided as complementary switches, i.e., each switch consists of a P and N channel pair of transistors connected in parallel. This parallel combination provides a closed switch when the voltage on the gate of the P channel transistor is connected to a negative supply voltage and the voltage on the gate of the N channel transistor is connected to a positive supply. Alternatively, the switch is open if the voltage on the gate of the P channel transistor is connected to a positive supply on the voltage on the gate of the N channel transistors connected to a negative supply. It will be seen that the switches are connected with the capacitors 33 and 34 in the same manner as illustrated in FIG. 3. Similarly, the terminals 31, 32 and 41 are connected in the circuit in the same manner. There is additionally shown a clock terminal 61 adapted to receive commutating signals which are applied on line 62 to the gates of one-half of the MOS transistors of the complementary switches and is applied through an MOS inverter 63 to a line 64 connected to the gates of the other half of the transistors of the complementary switches. It will thus be seen that with the application of the positive clock signal or commutating signal to line 62, and a negative clock signal to line 64, switches 37, 47, 36 and 43 will be closed, and switches 46, 39, 42 and 38 will be open. This then corresponds to the circuit connection of FIG. 4B and results in the connection of capacitor 34 between the voltage reference and an input line 66 of the amplifier through switches 43 and 47, respectively. At the same time, the capacitor 33 is connected across the input terminals 31 and 32 through switches 37 and 36, respectively. As the polarity of the clock signal of terminal 61 reverses, a negative signal is applied to line 62, and a positive signal is applied to line 64, so as to cause switches 46, 39, 42 and 38 to close or conduct, and switches 37, 47, 36 and 43 to open, so that the other capacitor 33 is connected between $V_{REF}$ and the amplifier on line 66 with capacitor 34 connected across the input terminals, which comprise the circuit connection of FIG. 4A.

The operational amplifier 44 of FIG. 5 includes an input N-channel transistor differential pair 71 and 72 biased by a resistor 73 connected to V− at the terminal 74. The non-inverting input line 66 of the amplifier is connected to the gate of transistor 71 and the gate of transistor 72 is connected to the inverting input, as shown at terminal 76. This inverting input 76 is illustrated to be connected to a reference voltage in the form of electrical ground through the resistor $R_1$. The transistors 71 and 72 are connected to P channel transistor current mirrors 77 and 78. The transistors 77 and 78 are connected through resistors 81 and 82, respectively, to V+, as indicated at the terminal 83, and an output transistor 84 is connected on one side to V+ and on the other side through a resistor 86 to V−. The output transistor 84 is controlled by connection of the gate thereof to the connection of transistors 71 and 77 with a compensating capacitor 87 connected between gate and drain of the MOS transistor 84. The output terminal 51 is shown to be connected to the negative side of the output transistor 84 and through the feedback resistor $R_2$ to the inverting amplifier input 76. Provision is made for nulling the offset voltage of this amplifier by means of a variable resistor 88 connected across the transistors 77 and 78. This nulling resistor 88 may be provided as an external element, in which case offset terminals, as illustrated, are provided as a part of the integrated circuit. It is also noted that the capacitors 33 and 34 may also be provided as external units of the integrated circuit and in this case, of course, capacitor terminals are provided as a part of the integrated circuit.

The operational amplifier illustrated in FIG. 5 and briefly described above, is only one example of an amplifier that is suitable for use in accordance with the present invention. As previously noted, a commutating autozero amplifier may be employed or some other suitable amplifier for this application.

The circuit of FIG. 5 illustrates one possible implementation of the present invention, wherein a pair of information storage capacitors 33 and 34 are each alternately switched, in this case by electrical signals applied to CMOS switches, between a first connection wherein the capacitor is charged to the input differential voltage and a second connection between a reference voltage, such as electrical ground, and the non-inverting input of the amplifier. As previously stated, the circuit of the present invention is highly advantageous in minimizing common mode rejection ratio errors and also in minimizing the sensitivity of the circuit to the performance of individual components, such as the resistors and capacitors. Prior art problems of resistor ratio matching are obviated by the present invention to thus provide a material advancement in the art.

The present invention provides a true isolation of amplifier input from an input bridge network, for example, and at the same time overcomes prior art problems of referencing a differential voltage to a third or reference voltage without dependence upon the actual voltage values between which the differential exists. It is also noted that the present invention is not limited to the use of a pair of capacitors, for switching of more than two capacitors may be employed. The present invention significantly reduces the cost and improves the performance of signal level translators, such as instrumentation amplifiers.

Although the present invention has been described above with respect to a particular preferred embodiment and in connection with a particular application, it will be appreciated by those skilled in the art that numerous modifications and variations are possible within the spirit of the present invention. It is not intended to limit the present invention by the particular terms of description or details of illustration.

What is claimed is:

1. A commutating signal level translator system comprising:
   a pair of input terminals adapted to have a differential voltage impressed thereacross,
   an amplifier having first and second inputs and an output,
   first and second capacitors,
   a reference voltage terminal,
   switching means connected to said capacitors for connecting said first capacitor across said input terminals and said second capacitor between said reference voltage terminal and said first amplifier input and reversing said capacitor connections,
   a resistor network connecting said second amplifier input to said reference voltage terminal and to said amplifier output, and
   first and second output terminals with said first output terminal connected to said amplifier output and said second output terminal connected to said reference voltage terminal.

2. The system of claim 1 further defined by said switching means comprising:
   a plurality of electrically controlled switches divided into two groups that are alternately closed and opened to connect said capacitors alternately across said input terminals and between said voltage reference terminal and said first amplifier input.

3. The system of claim 1 further defined by
   said switching means comprising first and second groups of CMOS switches, and
   means applying alternate clock pulses to said groups of switches for causing said first group to conduct while the second group is non-conducting and then causing said second group to conduct while the first group is non-conducting.

4. The system of claim 1 further defined by
   reversing the connections of said switching means at a rate in excess of the highest frequency component of said differential voltage.

5. The system of claim 1 further defined by
   said resistor network including a first resistor connecting said second amplifier input and said reference voltage terminal, and a second resistor connecting said amplifier output and said second amplifier input.

6. The system of claim 1 further defined by said switching means comprising eight switches divided into first and second groups of four switches each and means alternately opening and closing all of the switches of the first group while closing and opening all of the switches of said second group.

7. A commutating signal level transistor system comprising:
   first and second capacitors,
   first and second input terminals,
   a reference voltage terminal,
   an amplifier having first and second inputs and an output with a first resistor connecting the second amplifier input to said reference voltage terminal and a second resistor connecting said amplifier output to said second amplifier input,
   a pair of output terminals with a first terminal connected to said amplifier output and a second output terminal connected to said reference voltage terminal, and
   switching means comprising eight switches divided into first and second groups of four switches with said groups being adapted for alternate operation to connect said first capacitor across said input terminals and said second capacitor between said reference voltage terminal and the said first amplifier input and then reversing the connections to connect said second capacitor across said input terminals and said first capacitor between said reference voltage terminal and said first amplifier input.

8. The system of claim 7 further defined by said first group of switches comprising a first switch connecting a first side of said first capacitor to said first input terminal,
   a second switch connecting a second side of said first capacitor to said second input terminal,
   a third switch connecting a first side of said second capacitor to said reference voltage terminal, and
   a fourth switch connecting a second side of said second capacitor to said first amplifier input, and
   said second group of switches comprising
   a fifth switch connecting a first side of said second capacitor to said first input terminal,
   a sixth switch connecting a second side of said second capacitor to said second input terminal,
   a seventh switch connecting the first side of said first capacitor to said reference voltage terminal, and
   an eighth switch connecting the second side of said first capacitor to said first amplifier input.

9. The system of claim 7 further defined by said first amplifier input being a non-inverting input and said second amplifier input being an inverting input.

10. The system of claim 7 further defined by said reference voltage terminal being connected to electrical ground.

* * * * *